(12) United States Patent
Okada et al.

(10) Patent No.: US 8,896,058 B2
(45) Date of Patent: Nov. 25, 2014

(54) SEMICONDUCTOR DEVICE AND METHOD FOR PRODUCING SAME

(75) Inventors: Masaya Okada, Osaka (JP); Makoto Kiyama, Itami (JP); Yu Saitoh, Itami (JP); Seiji Yaegashi, Tokyo (JP); Mitsunori Yokoyama, Tokyo (JP); Kazutaka Inoue, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/884,229

(22) PCT Filed: Oct. 5, 2011

(86) PCT No.: PCT/JP2011/072916
§ 371 (c)(1),
(2), (4) Date: May 8, 2013

(87) PCT Pub. No.: WO2012/063578
PCT Pub. Date: May 18, 2012

(65) Prior Publication Data
US 2013/0221434 A1 Aug. 29, 2013

(30) Foreign Application Priority Data
Nov. 8, 2010 (JP) .................. 2010-250055

(51) Int. Cl.
| H01L 29/66 | (2006.01) |
| H01L 29/778 | (2006.01) |
| H01L 29/78 | (2006.01) |
| H01L 29/423 | (2006.01) |
| H01L 29/40 | (2006.01) |
| H01L 29/417 | (2006.01) |
| H01L 29/20 | (2006.01) |

(52) U.S. Cl.
CPC ........ H01L 29/7827 (2013.01); H01L 29/7789 (2013.01); H01L 29/66666 (2013.01); H01L 29/4236 (2013.01); H01L 29/41766 (2013.01); H01L 29/66462 (2013.01); H01L 29/7788 (2013.01); H01L 29/407 (2013.01); H01L 29/2003 (2013.01)

USPC ...... 257/330; 257/302; 257/76; 257/E27.091; 257/E29.257

(58) Field of Classification Search
USPC .................. 257/330, 302, E27.091, E29.257
See application file for complete search history.

(56) References Cited

U.S. PATENT DOCUMENTS

2006/0220060 A1* 10/2006 Nakata et al. ................. 257/189
2009/0278197 A1* 11/2009 Ohta et al. .................... 257/330

FOREIGN PATENT DOCUMENTS

| JP | 05-007002 A | 1/1993 |
| JP | 2001-267570 A | 9/2001 |

(Continued)

OTHER PUBLICATIONS

International Search Report in PCT International Patent Application No. PCT/JP2011/072916, dated Dec. 27, 2011.

(Continued)

*Primary Examiner* — Timor Karimy
(74) *Attorney, Agent, or Firm* — Venable LLP; Michael A. Sartori; Tamatane J. Aga

(57) ABSTRACT

It is an object to improve the breakdown voltage characteristics of a vertical semiconductor device having an opening and including a channel formed of two-dimensional electron gas in the opening. The vertical semiconductor device includes a GaN-based stacked layer 15 having an opening 28 and the GaN-based stacked layer 15 includes n-type GaN-based drift layer 4/p-type GaN-based barrier layer 6/n-type GaN-based contact layer 7. The vertical semiconductor device includes a regrown layer 27 located so as to cover the opening, the regrown layer 27 including an electron drift layer 22 and an electron supply layer 26, a source electrode S, and a gate electrode G located on the regrown layer. The gate electrode G covers a portion having a length corresponding to the thickness of the p-type GaN-based barrier layer and is terminated at a position on the wall surface, the position being away from the bottom portion of the opening.

7 Claims, 6 Drawing Sheets

(56) References Cited

FOREIGN PATENT DOCUMENTS

| | | |
|---|---|---|
| JP | 2006-286942 A | 10/2006 |
| JP | 2007-200980 A | 8/2007 |
| JP | 2009-200103 A | 9/2009 |

OTHER PUBLICATIONS

Notification of Reasons for Rejection in Japanese Patent Application No. 2010-250055, dated Jan. 5, 2012.

* cited by examiner

SEMICONDUCTOR DEVICE AND METHOD FOR PRODUCING SAME

TECHNICAL FIELD

The present invention relates to a semiconductor device used for high power switching and a method for producing the semiconductor device, and particularly to a semiconductor device that uses a GaN-based semiconductor among nitride-based semiconductors and a method for producing the semiconductor device.

BACKGROUND ART

High reverse breakdown voltage and low on-resistance are required for high-current switching devices. Field effect transistors (FETs) that use a group III nitride-based semiconductor are excellent in terms of, for example, high breakdown voltage and high-temperature operation because of their wide band gap. Vertical transistors that use a GaN-based semiconductor have been particularly receiving attention as transistors for controlling high power. For example, PTL 1 proposes a vertical GaN-based FET whose mobility is increased and whose on-resistance is decreased by forming an opening in a GaN-based semiconductor and forming a regrown layer including a channel of two-dimensional electron gas (2DEG) in a wall surface of the opening. In this vertical GaN-based FET, a structure including a p-type GaN barrier layer and the like is proposed in order to improve the breakdown voltage characteristics and pinch-off characteristics.

CITATION LIST

Patent Literature

PTL 1: Japanese Unexamined Patent Application Publication No. 2006-286942

SUMMARY OF INVENTION

Technical Problem

In the above vertical GaN-based FET, the breakdown voltage characteristics may be improved by a depletion layer formed in a pn junction between the p-type GaN barrier layer and an n$^-$-type GaN drift layer. However, the opening penetrates through the p-type GaN barrier layer and reaches the n$^-$-type GaN drift layer. Therefore, a gate electrode G faces a drain electrode without the p-type GaN barrier layer disposed therebetween. When the semiconductor device is used as a high-power switching device, a voltage of several hundred volts to one thousand and several hundred volts is applied between the source electrode (ground) and the drain electrode in the off-state. A voltage of about minus several volts is applied to the gate electrode in the off-state. Because of the high source-drain voltage, electric field concentration is generated in a bottom portion of the opening, in particular, in a portion of the n$^-$-type GaN drift layer near a ridge (corner in a sectional view) of the bottom portion. As a result, breakdown of a semiconductor occurs from an uneven portion or the like inevitably provided by the ridge of the bottom portion of the opening. The breakdown voltage characteristics in the off-state in the bottom portion of the opening cannot be ensured by the above-described p-type barrier layer.

It is an object of the present invention to provide a vertical semiconductor device having an opening and including a channel and a gate electrode in the opening. In the semiconductor device, the breakdown voltage characteristics in the off-state are improved. It is another object of the present invention to provide a method for producing the semiconductor device.

Solution to Problem

A semiconductor device of the present invention is a vertical semiconductor device including a GaN-based stacked layer having an opening. In the semiconductor device, the GaN-based stacked layer includes n-type GaN-based drift layer/p-type GaN-based barrier layer/n-type GaN-based contact layer in that order to the top layer side and the opening extends from a top layer and reaches the n-type GaN-based drift layer. The semiconductor device includes a regrown layer located so as to cover a wall surface and a bottom portion of the opening, the regrown layer including an electron drift layer and an electron supply layer; a source electrode that is in contact with the n-type GaN-based contact layer and the regrown layer around the opening; and a gate electrode located on the regrown layer. The gate electrode covers a portion of a wall surface of the regrown layer, the portion having a length corresponding to a thickness of the p-type barrier layer, and is terminated at a position on the wall surface, the position being away from a bottom portion of the regrown layer that covers the bottom portion of the opening.

In vertical semiconductor devices, a high voltage of several hundred volts to one thousand and several hundred volts is applied between the source electrode disposed on one principal surface (a top surface of the GaN-based semiconductor layer) and the drain electrode that faces the source electrode with the GaN-based semiconductor layer sandwiched therebetween. The source electrode is fixed at a ground potential and a high voltage is applied to the drain electrode. The gate electrode is held at minus several volts, such as −5 V, in the off-state for the purpose of opening and closing the channel. That is, in the off-state, the gate electrode has a minimum potential. The voltage difference between the gate electrode and the drain electrode is 5 V higher than the voltage difference between the source electrode and the drain electrode.

According to the above structure, the gate electrode does not face and is disposed away from the portion of the n-type GaN-based drift layer that is in contact with, from the outside, a ridge (corner in a longitudinal sectional view) at which the bottom portion and wall surface of the opening intersect each other. The gate electrode does not have a protruding portion located so as to be fitted to the ridge or corner from the inside. In existing semiconductor devices, the protruding portion having the minimum potential contributes to the generation of high electric field concentration in the portion of the n-type GaN-based drift layer that faces and contacts the protruding portion, compared with a plate-shaped minimum potential-holding member. As described above, the gate electrode of the semiconductor device according to the present invention does not have such a protruding portion fitted to the corner from the inside. Furthermore, the distance between the end of the gate electrode and the drain electrode is slightly increased.

Therefore, a high level of electric field concentration that has been generated in existing semiconductor devices is not generated in the off-state. Even if a high voltage is applied between the drain electrode and the gate electrode, the electric field concentration in the portion of the n-type GaN-based drift layer that is in contact with the ridge is reduced. Consequently, the breakdown of the portion of the n-type GaN-based drift layer does not readily occur.

Regarding the conductivity type, n-type or p-type, the concentration of an impurity is not limited and may be any concentration from low concentration to high concentration.

In addition to the effect of reducing electric field concentration in the n-type GaN-based drift layer by disposing the gate electrode on the wall surface of the opening so that the terminal portion of the gate electrode is away from the corner, the following effect can be produced by covering a region on the wall surface corresponding to the p-type GaN-based barrier layer with the gate electrode. The p-type GaN-based barrier layer is inserted between the n-type GaN-based drift layer and the n-type GaN-based contact layer in order to (1) improve the pinch-off characteristics and (2) ensure the reverse breakdown voltage characteristics as described above. The p-type GaN-based barrier layer (1) improves pinch-off characteristics by increasing the potential of the electron drift layer in the regrown layer and (2) provides breakdown voltage characteristics in a certain range by extending a depletion layer on the n-type GaN-based drift layer side under the application of reverse bias voltage. The gate electrode on the wall surface of the opening is located in a region of the electron drift layer which is located on the p-type GaN-based barrier layer side and whose potential is increased, and the on-off control is performed on the electron drift layer. Thus, better pinch-off characteristics can be produced.

A pn diode (p-type GaN-based barrier layer/n-type GaN-based drift layer) surrounding the bottom portion of the opening has a breakdown voltage higher than that of an existing Schottky diode (gate electrode/semiconductor layer) in the bottom portion of the opening, which also contributes to the above-described effect of improving the breakdown voltage characteristics by disposing the gate electrode only on the upper side of the opening.

The semiconductor device can further include a field plate electrode in the bottom portion of the regrown layer, the field plate electrode being located so as to cover at least a ridge at which the wall surface and bottom portion of the regrown layer intersect each other.

The presence of the field plate electrode shields the gate electrode serving as the minimum potential-holding member and thus local electric field concentration can be prevented from occurring in the n-type GaN-based drift layer because of general or unexpected factors.

The semiconductor device can further include an insulating film disposed between the bottom portion of the regrown layer and the field plate electrode.

Thus, the electric field concentration in the n-type GaN-based drift layer can be more stably reduced.

The semiconductor device can further include an insulating layer disposed on the regrown layer and below the gate electrode.

By disposing the insulating layer below the gate electrode, a gate leak current generated when positive voltage is applied to the gate electrode can be reduced, which allows high-current operation. Since the threshold voltage can be further shifted in a positive direction, normally-off is easily achieved.

In a method for producing a semiconductor device according to the present invention, a vertical GaN-based semiconductor device is produced. The production method includes a step of forming a p-type GaN-based barrier layer on an n-type GaN-based drift layer; a step of forming an n-type GaN-based contact layer on the p-type GaN-based barrier layer; a step of forming, by etching, an opening that extends from a top layer and reaches the n-type GaN-based drift layer; a step of epitaxially growing a regrown layer so as to cover a wall surface and a bottom portion of the opening, the regrown layer including an electron drift layer and an electron supply layer; a step of forming a source electrode around the opening so as to be in contact with the n-type GaN-based contact layer and the regrown layer; and a step of forming a gate electrode on the regrown layer. In the step of forming the gate electrode, the gate electrode is formed so as to cover a portion of a wall surface of the regrown layer, the portion having a length corresponding to a thickness of the p-type GaN-based barrier layer, and so as to be terminated at a position on the wall surface, the position being away from a bottom portion of the regrown layer.

According to the above method, a semiconductor device in which electric field concentration in the portion of the n-type GaN-based drift layer that is in contact with the ridge or corner is reduced can be produced by making a minor change in the production method. That is, the structure in which the gate electrode and the n-type GaN-based drift layer face each other with the ridge or corner sandwiched therebetween and thus discharge is easily caused can be avoided. The distance between the end of the gate electrode and the drain electrode is also slightly increased.

The production method can further include, before or after the step of forming the gate electrode, a step of forming a field plate electrode so as to cover the bottom portion of the regrown layer and so as to be away from the gate electrode.

According to this method, a semiconductor device having good breakdown voltage characteristics can also be easily produced.

In the step of forming the field plate, an insulating film can be formed so as to cover the bottom portion of the regrown layer and a terminal portion of the gate electrode before the formation of the field plate electrode, and then the field plate electrode can be formed on the insulating film.

According to this method, a semiconductor device whose breakdown voltage characteristics are further stabilized can be easily produced.

Advantageous Effects of Invention

According to the semiconductor device of the present invention, in a vertical semiconductor device having an opening and including a channel and a gate electrode in the opening, the breakdown voltage characteristics in the off-state can be improved.

REFERENCE SIGNS LIST

Figure 1:
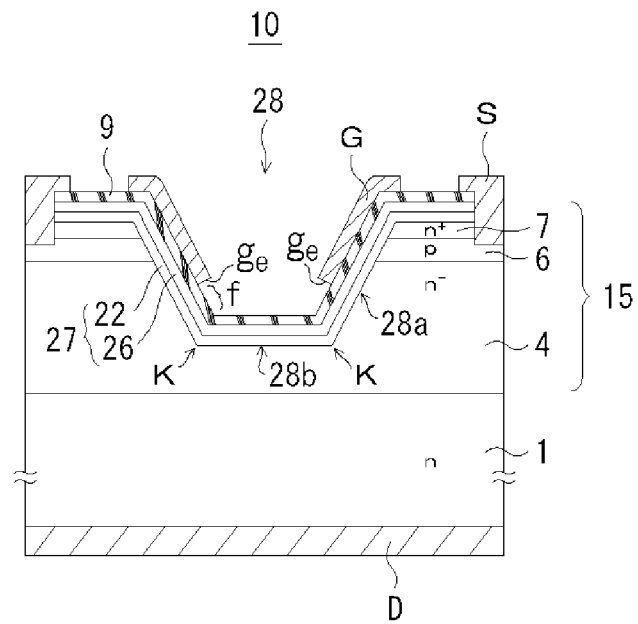
FIG. 1 is a sectional view showing a vertical GaN-based FET (semiconductor device) according to a first embodiment of the present invention (a sectional view taken along line I-I of FIG. 2).

1 GaN substrate
4 $n^-$-type GaN drift layer
6 p-type GaN barrier layer
7 $n^+$-type GaN contact layer
9 insulating layer
10 semiconductor device (vertical GaN-based FET)
12 gate wiring line
13 gate pad
15 GaN-based stacked layer
22 GaN electron drift layer
26 AlGaN electron supply layer
27 regrown layer
28 opening
28a wall surface of opening
28b bottom portion of opening
31 field plate electrode
33 insulating film
D drain electrode
f distance between corner and terminal portion of gate electrode
G gate electrode
$g_e$ terminal portion of gate electrode on bottom portion side
K ridge or corner of opening
M1 resist pattern
S source electrode

DESCRIPTION OF EMBODIMENTS

First Embodiment

FIG. 1 is a sectional view of a vertical GaN-based FET (semiconductor device) 10 according to a first embodiment of the present invention. The vertical GaN-based FET 10 includes a conductive GaN substrate 1 and $n^-$-type GaN drift layer 4/p-type GaN barrier layer 6/$n^+$-type GaN contact layer 7 epitaxially grown on the GaN substrate 1. The $n^-$-type GaN drift layer 4/p-type GaN barrier layer 6/$n^+$-type GaN contact layer 7 is successively formed to constitute a GaN-based stacked layer 15. A buffer layer composed of an AlGaN layer or GaN layer may be inserted between the GaN substrate 1 and the $n^-$-type GaN drift layer 4 depending on the type of the GaN substrate 1.

The GaN substrate 1 may be a substrate including a GaN layer that is in ohmic contact with a support substrate. Alternatively, as described above, by removing a portion having a thickness corresponding to the thickness of a GaN substrate or the like, only a thin GaN layer may be left as a base film for the epitaxial growth of a GaN-based stacked layer in the form of products. The GaN substrate, the substrate including a GaN layer that is in ohmic contact with a support substrate, the thin GaN layer left as a base in the form of products, and the like may be simply referred to as a GaN substrate.

In this embodiment, the p-type GaN barrier layer 6 is used as the p-type GaN-based barrier layer, but a p-type AlGaN layer may be used. Regarding other layers constituting the GaN-based stacked layer 15, other GaN-based semiconductor layers may be used instead of the GaN layers, if necessary.

In the GaN-based stacked layer 15, an opening 28 is formed so as to penetrate from the $n^+$-type GaN contact layer 7 to the p-type GaN barrier layer 6 and reach the $n^-$-type GaN drift layer 4. The opening 28 is defined by a wall surface (side surface) 28a and a bottom portion 28b. A regrown layer 27 is epitaxially grown so as to cover the wall surface 28a and bottom portion 28b of the opening 28 and the top layer ($n^+$-type GaN contact layer 7) of the GaN-based stacked layer 15. The regrown layer 27 is constituted by an insulating GaN (i-type GaN) electron drift layer 22 and an AlGaN electron supply layer 26. An intermediate layer composed of AlN or the like may be inserted between the i-type GaN electron drift layer 22 and the AlGaN electron supply layer 26. A source electrode S is located on the GaN-based stacked layer 15 so as to be electrically connected to the regrown layer 27, the $n^+$-type GaN contact layer 7, and the p-type GaN barrier layer 6. In FIG. 1, the source electrode S extends downwards and has a side surface that is in contact with the end face of the regrown layer 27 and the $n^+$-type GaN contact layer 7 and an end portion that is in contact with the p-type GaN barrier layer 6. Thus, an electrical connection is established. A drain electrode D is located on the bottom surface of the GaN substrate 1.

An insulating layer 9 is located below a gate electrode G so as to cover the regrown layer 27. The insulating layer 9 is disposed in order to reduce a gate leak current generated when positive voltage is applied to the gate electrode, which allows high-current operation. Since the threshold voltage can be further shifted in a positive direction, normally-off is easily achieved. Note that the insulating layer 9 is not necessarily disposed.

In the on-state, in the regrown layer 27, two-dimensional electron gas (2DEG) is generated in the i-type GaN electron drift layer 22 at a position near the interface between the i-type GaN electron drift layer 22 and the AlGaN electron supply layer 26. Such two-dimensional electron gas is generated in the i-type GaN electron drift layer 22 at a position near the interface between the i-type GaN electron drift layer 22 and the AlGaN electron supply layer due to, for example, spontaneous polarization or piezoelectric polarization caused by difference in lattice constant. Electrons flow from the source electrode S to the drain electrode D through the two-dimensional electron gas and the $n^-$-type GaN drift layer 4. Since the i-type GaN electron drift layer 22 and the AlGaN electron supply layer 26 in the regrown layer 27 are successively grown in the same growth chamber, the density of impurity level or the like at the interface can be reduced to a low value. Therefore, a high current (per unit area) can be caused to flow with low on-resistance while having a structure in which a high current is caused to flow in a thickness direction by forming the opening 28.

The feature of this embodiment is the shape of the gate electrode G. The gate electrode G covers a portion of the wall surface of the regrown layer 27, the portion having a length corresponding to the thickness of the p-type GaN barrier layer 6, and is terminated at a position on the wall surface, the position being away from a bottom portion of the regrown layer 27 that covers the bottom portion 28b of the opening. A terminal portion $g_e$ is an end of the gate electrode in the opening 28. In FIG. 1, the terminal portion $g_e$ is at a distance f from a ridge (corner in FIG. 1) K at which the bottom portion 28b and wall surface 28a of the opening 28 intersect each other. When a description is made using a sectional view, the ridge is referred to as a corner K. In a strict sense, it should be said that the distance f is measured from a position corresponding to a corner K of the insulating layer 9. However, the presence of the insulating layer provides only a small difference. When a great influence is not exerted, the description is made without distinguishing the corner K of the opening 28 and the corner K of the insulating layer 9. Also in the case of a description other than the description concerning the distance f, unless a problem arises, the corner of the opening 28 is not distinguished from the corner K in a portion of the regrown layer 27 or insulating layer 9 that is in contact with the corner of the opening 28.

As described above, in the off-state, a high voltage of several hundred volts to one thousand and several hundred volts is applied between the source electrode S held at a ground potential and the drain electrode D. The gate electrode is held at minus several volts, such as −5 V, in the off-state for the purpose of opening and closing the channel. In the off-state, the gate electrode has a minimum potential.

Existing vertical semiconductor devices having an opening have a structure in which the gate electrode G fully covers the bottom portion 28b and wall surface 28a of the opening 28 in a continuous manner. In this structure, high electric field concentration is generated in a portion of the n⁻-type GaN drift layer 4 that is in contact with the ridge or corner K under the boundary conditions of the potential. In such existing semiconductor devices, the gate electrode has a protruding portion fitted to the ridge or corner from the inside. In the portion of the n⁻-type GaN drift layer 4 that is in contact with the corner K from the outside, electric lines of force become denser in a direction from the outside toward the inside of the corner K and thus dense electric lines of force flow in the corner K. Therefore, high electric field concentration is generated in the portion of the n⁻-type GaN drift layer 4 that is in contact with the protruding portion of the gate electrode G having a minimum potential. The n⁻-type GaN drift layer 4 in this portion may be broken as a result of this electric field concentration.

The gate electrode G of the semiconductor device 10 according to this embodiment is terminated at a position on the wall surface 28a of the opening 28 and the terminal portion $g_e$ is away from the corner K by the distance f. In other words, the minimum potential-holding member is away from the corner K by at least the distance f. In this embodiment, the gate electrode G serving as the minimum potential-holding member does not have a protruding portion fitted to the corner K from the inside and has a terminal portion $g_e$ at a position that is away from the corner K by the distance f. By providing the distance f, the electric field concentration in the portion of the n⁻-type GaN drift layer 4 that is in contact with the corner is considerably reduced. As a result, high electric field concentration is not generated in the portion of the n⁻-type GaN drift layer 4 that is in contact with the ridge or corner K and thus dielectric breakdown caused by high voltage does not readily occur.

The p-type impurity concentration of the p-type GaN barrier layer 6 may be about $1\times10^{17}$ (1E17) cm$^{-3}$ to $1\times10^{19}$ (1E19) cm$^{-3}$. The p-type impurity may be an impurity, such as Mg, that forms an acceptor in a GaN-based semiconductor.

The thickness of the p-type GaN barrier layer 6 is dependent on, for example, the thickness of the n⁻-type GaN drift layer, and thus the range of the thickness cannot be determined in a general manner. However, the typical thickness often used in many devices is about 0.3 μm to 1 μm. If the thickness is less than 0.3 μm, breakdown voltage characteristics and pinch-off characteristics cannot be sufficiently produced and thus 0.3 μm may be set as the lower limit of the thickness. If the p-type GaN barrier layer 6 having a thickness of about 0.3 μm to 1 μm has an excessively high Mg content, straight movement toward the end face f the p-type GaN barrier layer 6 occurs, which adversely affects the channel (increases the on-resistance). The reverse voltage characteristics (breakdown voltage characteristics) at a pn junction between the p-type GaN barrier layer 6 and the n⁻-type GaN drift layer during channel interruption are also degraded.

The thickness of the n⁺-type GaN contact layer 7 may be about 0.1 μm to 0.6 μm. The length of the n⁺-type GaN contact layer 7 may be 0.5 μm or more and 5 μm or less.

Figure 2:
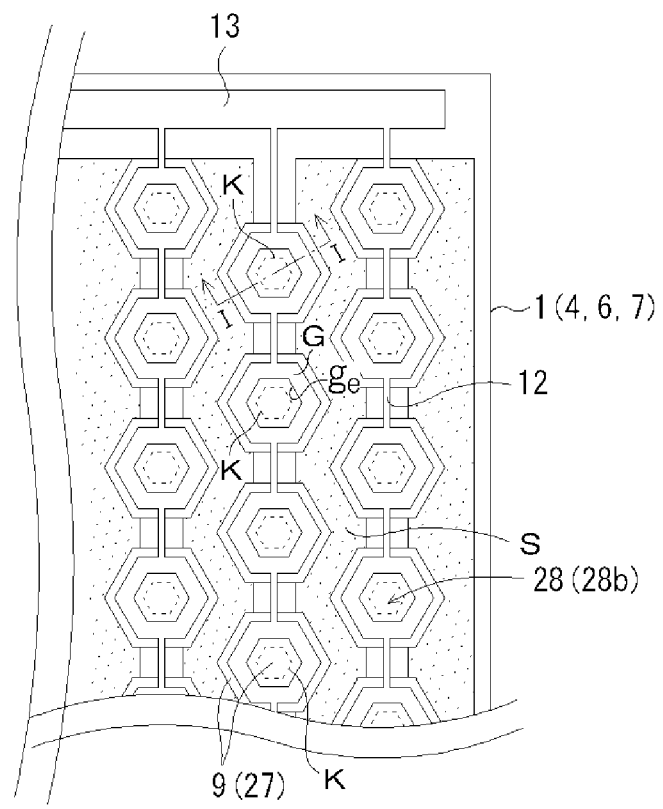
FIG. 2 is a plan view of the vertical GaN-based FET in FIG. 1.

FIG. 2 is a plan view of the vertical GaN-based semiconductor device 10 shown in FIG. 1, and FIG. 1 is a sectional view taken along line I-I of FIG. 2. Referring to FIG. 2, the opening 28 has a hexagonal shape and the terminal portion $g_e$ of the gate electrode G has a hexagonal shape, and a region around the opening 28 is substantially covered with the source electrode S while the source electrode S does not overlap a gate wiring line 12. Consequently, a closest-packed structure (honey-comb structure) is formed and thus the gate electrode has a long perimeter per unit area. By employing such a shape, the on-resistance can also be decreased. An electric current flows from the source electrode S and enters a channel (electron drift layer 22) in the regrown layer 27 directly or through the n⁺-type GaN contact layer 7. Then, the electric current flows to the drain electrode D through the n⁻-type GaN drift layer 4. In order to prevent the source electrode S and the wiring line thereof from interfering with a gate structure including the gate electrode G, the gate wiring line 12, and a gate pad 13, the source wiring line is disposed on an interlayer-insulating layer (not shown). A via hole is formed in the interlayer-insulating layer, and the source electrode S including a conductive portion obtained by filling the via hole is conductively connected to a source conductive layer (not shown) on the interlayer-insulating layer. As a result, a source structure including the source electrode S can have low electrical resistance and high mobility, which are suitable for high-power devices.

The perimeter of openings per unit area can also be increased by densely arranging elongated openings instead of employing the hexagonal honey-comb structure. Consequently, the current density can be improved. In this case, the terminal portion $g_e$ of the gate electrode G is also located on the wall surface and has a shape extending in parallel with the elongated openings.

Figure 3:
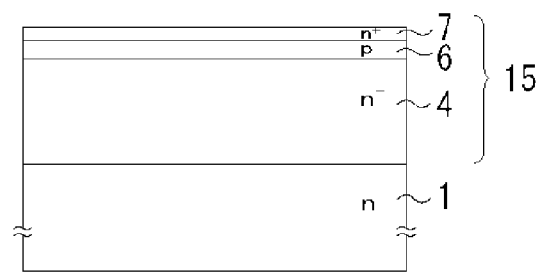
FIG. 3 is a diagram showing a method for producing the vertical GaN-based FET in FIG. 1, the diagram showing the state in which an epitaxial stacked layer including layers up to a contact layer has been formed on a substrate including a GaN layer that is in ohmic contact with a support substrate.

A method for producing the semiconductor device 10 according to this embodiment will be described. As shown in FIG. 3, a stacked layer 15 including n⁻-type GaN drift layer 4/p-type GaN barrier layer 6/n⁺-type GaN contact layer 7 is grown on a GaN substrate 1 corresponding to the above-described GaN substrate. A GaN-based buffer layer (not shown) may be inserted between the GaN substrate 1 and the n⁻-type GaN drift layer 4.

The formation of the above layers may be performed by, for example, metal-organic chemical vapor deposition (MOCVD). By performing growth using MOCVD, a stacked layer 15 having good crystallinity can be formed. In the case where the GaN substrate 1 is formed by growing a gallium nitride film on a conductive substrate using MOCVD, trimethylgallium is used as a gallium raw material. High-purity ammonia is used as a nitrogen raw material. Purified hydrogen is used as a carrier gas. The purity of the high-purity ammonia is 99.999% or more and the purity of the purified hydrogen is 99.999995% or more. A hydrogen-based silane may be used as a Si raw material for an n-type dopant (donor) and cyclopentadienyl magnesium may be used as a Mg raw material for a p-type dopant (acceptor).

A conductive GaN substrate having a diameter of two inches is used as the conductive substrate. The substrate is cleaned at 1030° C. at 100 Torr in an atmosphere of ammonia and hydrogen. Subsequently, the temperature is increased to 1050° C. and a gallium nitride layer is grown at 200 Torr at a V/III ratio of 1500, which is the ratio of the nitrogen raw material and gallium raw material. The formation method of the GaN layer on the conductive substrate is employed for not only the formation of the GaN substrate 1 but also the growth of the stacked layer 15 on the GaN substrate 1.

By employing the above-described method, the $n^-$-type GaN drift layer 4/p-type GaN barrier layer 6/$n^+$-type GaN contact layer 7 is grown on the GaN substrate 1 in that order.

Figure 4:
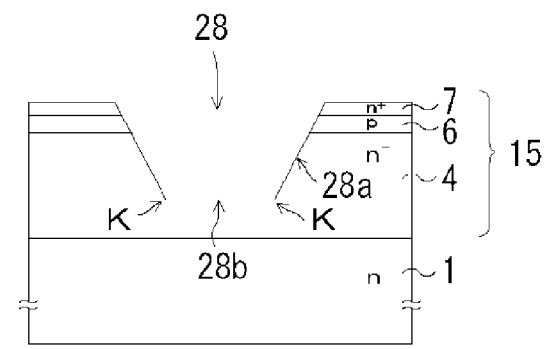
FIG. 4 is a diagram showing the state in which an opening has been formed by etching.
Figure 5A:
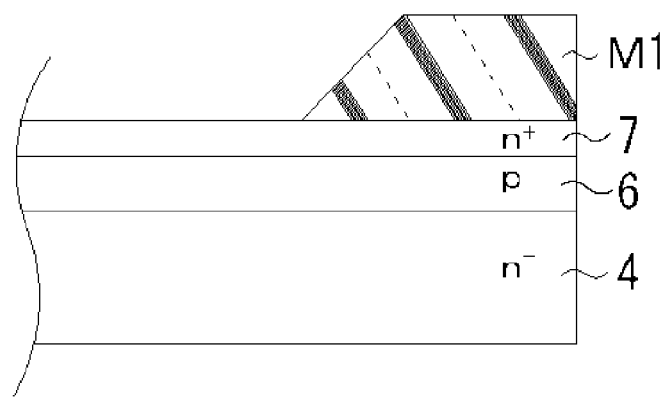
FIG. 5A is a diagram showing the state in which, at the stage of forming an opening by RIE, a resist pattern has been formed.
Figure 5B:
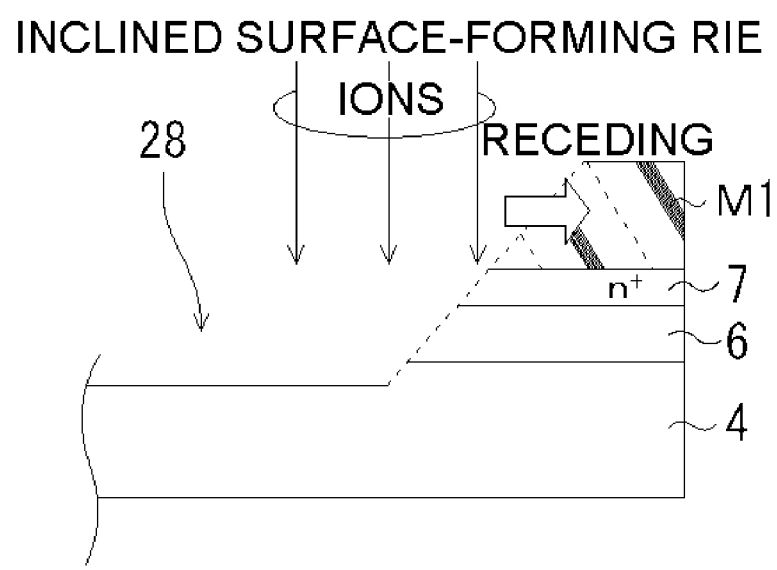
FIG. 5B is a diagram showing the state in which, at the stage of forming an opening by RIE, the stacked layer is etched down by performing ion irradiation and an opening is expanded (caused to recede).

Subsequently, as shown in FIG. 4, an opening 28 is formed by reactive ion etching (RIE). As shown in FIGS. 5A and 5B, a resist pattern M1 is formed on the top of epitaxial layers 4, 6, and 7. The resist pattern M1 is then etched by RIE to cause the resist pattern M1 to recede, whereby an opening is expanded to form an opening 28. In this RIE process, the inclined surface of the opening 28, that is, the end face of the stacked layer 15 is damaged by being subjected to ion irradiation. In the damaged portion, for example, a high-density region of dangling bonds and lattice defects is formed. Conductive impurities derived from an RIE equipment or unspecified sources reach the damaged portion and thus enrichment occurs. The formation of the damaged portion results in an increase in drain leak current and thus the restoration needs to be performed. When hydrogen and ammonia are contained at certain levels, the restoration regarding the dangling bonds and the like and the removal and passivation of the impurities can be achieved during the growth of a regrown layer 27 described below.

Figure 6:
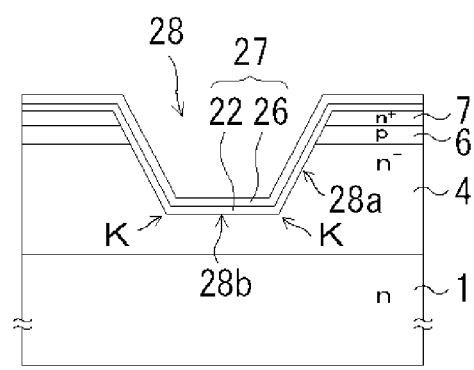
FIG. 6 is a diagram showing the state in which a regrown layer has been formed in the opening.

Subsequently, the resist pattern M1 is removed and the wafer is cleaned. The wafer is inserted into an MOCVD apparatus and a regrown layer 27 including an electron drift layer 22 composed of undoped GaN and an electron supply layer 26 composed of undoped AlGaN is grown as shown in FIG. 6. In the growth of the undoped GaN layer 22 and undoped AlGaN layer 26, thermal cleaning is performed in an atmosphere of ($NH_3+H_2$), and then an organic metal material is supplied while ($NH_3+H_2$) is being introduced. In the thermal cleaning before the formation of the regrown layer 27 or in the formation of the regrown layer 27, the restoration regarding the damaged portion and the removal and passivation of the conductive impurities are allowed to proceed.

Figure 7:
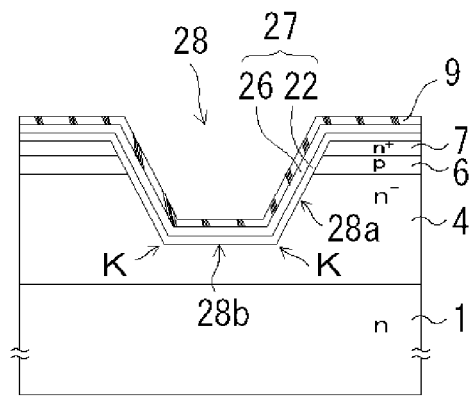
FIG. 7 is a diagram showing the state in which an insulating layer has been grown on the regrown layer.

Subsequently, the wafer is taken out of the MOCVD apparatus and an insulating layer 9 is grown as shown in FIG. 7. A source electrode S and a drain electrode D are then formed on the top surface of the epitaxial layer and the bottom surface of the GaN substrate 1, respectively, by photolithography and electron beam deposition as shown in FIG. 1.

In the formation of the gate electrode G, a resist pattern that covers the bottom portion 28b of the opening and the corner K may be formed in the opening 28. Thus, the gate electrode G can be formed so that the terminal portion $g_e$ of the gate electrode G is located within a region on the wall surface 28a of the opening, that is, the terminal portion $g_e$ is away from the corner K by the distance f.

<Modification of Semiconductor Device in FIG. 1>

Figure 8:
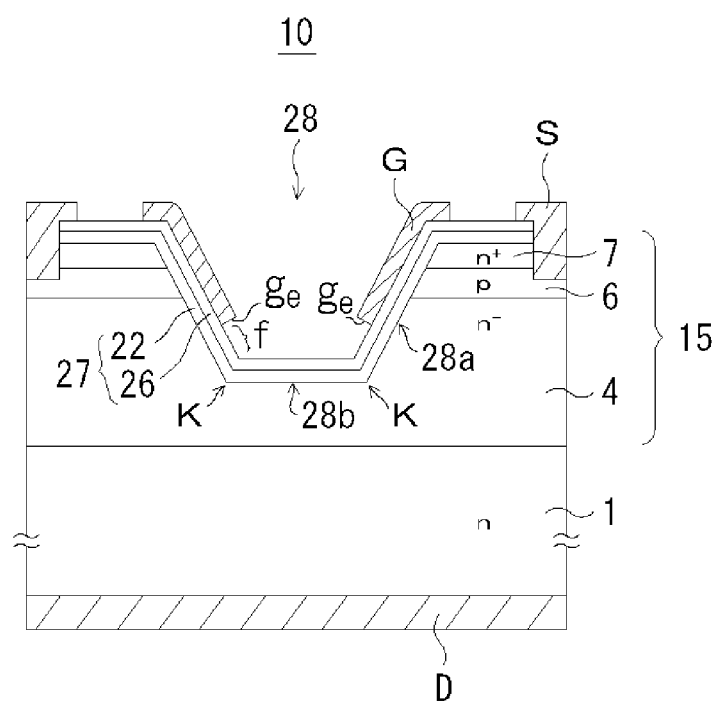
FIG. 8 is a sectional view of a semiconductor device that belongs to the first embodiment of the present invention, which is a modification of the semiconductor device in FIG. 1.

FIG. 8 shows a semiconductor device 10 according to an embodiment of the present invention, which is a modification of the first embodiment.

In this modification, an insulating layer that covers the regrown layer 27 is not disposed below the gate electrode G unlike the semiconductor device in FIG. 1. Even if the insulating layer is not disposed, the dielectric breakdown in the portion of the $n^-$-type GaN drift layer 4 that is in contact with the corner K can be avoided by terminating the gate electrode G at a position that is away from the bottom portion 28b of the opening by the distance f.

Second Embodiment

Figure 9:
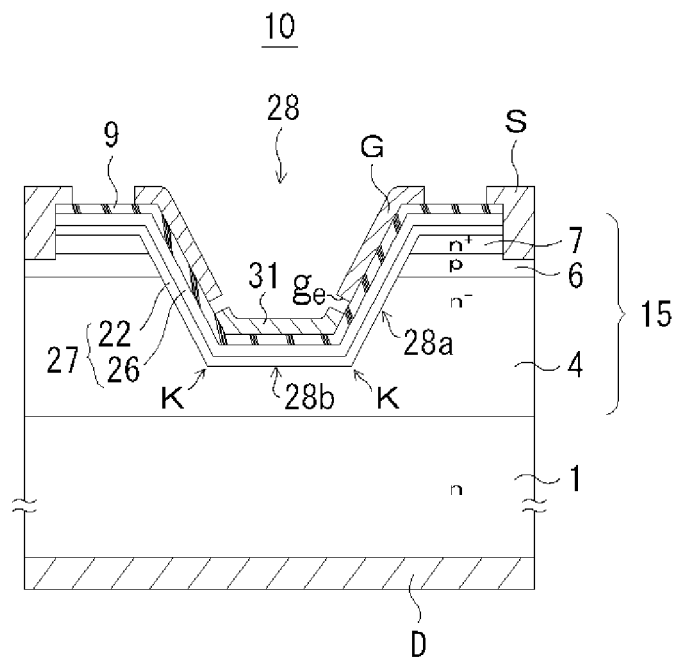
FIG. 9 is a sectional view showing a vertical GaN-based FET (semiconductor device) according to a second embodiment of the present invention.

FIG. 9 is a diagram showing a semiconductor device according to a second embodiment of the present invention. The feature of this embodiment is that a field plate electrode 31 is disposed over the bottom portion 28b and corner K of the opening. The field plate electrode 31 may be fixed at a ground potential or unfixed. The presence of the field plate electrode interrupts the gate electrode serving as the minimum potential-holding member to make the potential distribution uniform. Thus, local electric field concentration can be prevented from occurring in the n-type GaN-based drift layer as a result of general or unexpected factors.

When the field plate electrode 31 and the gate electrode G are disposed, the respective resist patterns are successively formed to ensure a distance f between the field plate electrode 31 and the gate electrode G.

Other structures and effects are the same as those in the first embodiment.

<Modifications 1 and 2 of Semiconductor Device in FIG. 9>

Figure 10:
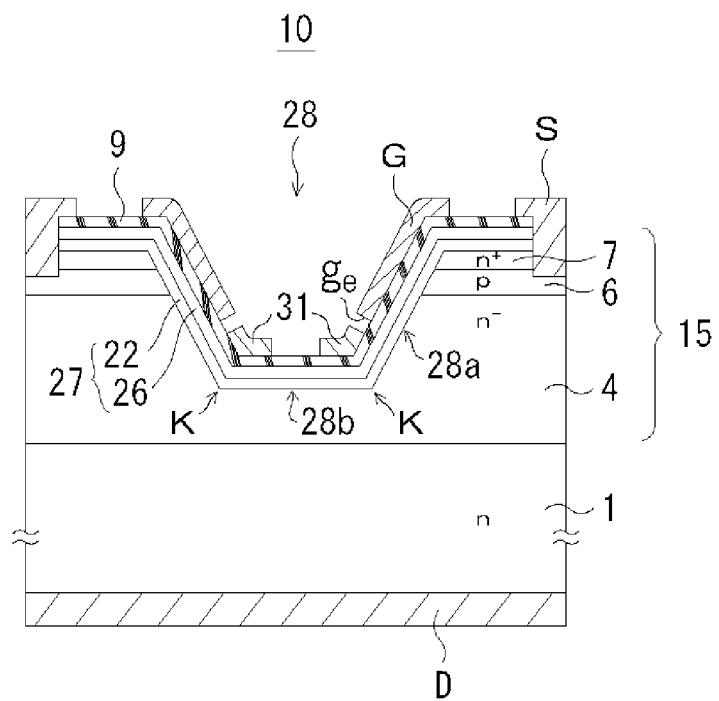
FIG. 10 is a sectional view of a semiconductor device that belongs to the second embodiment of the present invention, which is modification 1 of the semiconductor device in FIG. 9.

FIG. 10 shows a semiconductor device 10 according to an embodiment of the present invention, which is modification 1 of the semiconductor device in FIG. 9. In this modification 1, the field plate electrode 31 is locally disposed at the corner K of the opening. The field plate electrode 31 is disposed only in a portion in which the highest electric field concentration is generated. Substantially the same effect of improving breakdown voltage characteristics can be produced by using a field plate electrode 31 having an area smaller than that of the semiconductor device in FIG. 9.

Figure 11:
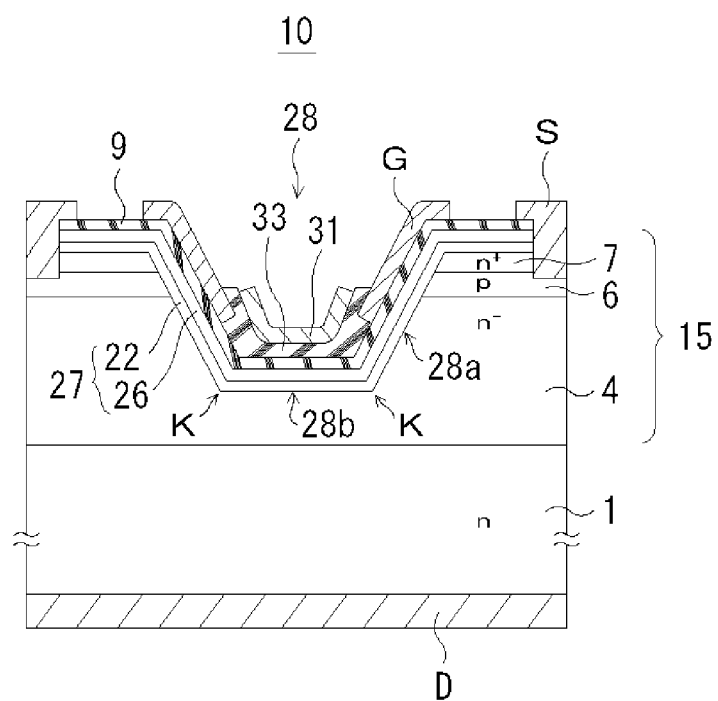
FIG. 11 is a sectional view of a semiconductor device that belongs to the second embodiment of the present invention, which is modification 2 of the semiconductor device in FIG. 9.

FIG. 11 shows a semiconductor device 10 according to an embodiment of the present invention, which is modification 2 of the semiconductor device in FIG. 9. In this modification 2, the field plate electrode 31 is disposed while an insulating film 33 is provided, in particular, between the gate electrode G and the field plate electrode 31. As a result, the $n^-$-type GaN drift layer 4 at the corner K and at the end of the gate electrode G does not readily undergo dielectric breakdown while the gate electrode G is insulated from the field plate electrode 31.

Also in the second embodiment and the modifications thereof, the formation of the insulating layer 9 can be omitted.

The structures disclosed in the above embodiments of the present invention are mere examples and the scope of the present invention is not limited to these embodiments. The scope of the present invention is defined by the appended claims, and all changes that fall within the scope of the claims and the equivalence thereof are therefore embraced by the claims.

INDUSTRIAL APPLICABILITY

According to the semiconductor device or the like of the present invention, in a vertical semiconductor device having an opening, the breakdown voltage characteristics in the off-state can be improved by limiting the shape and arrangement of a gate electrode. Furthermore, by disposing a field plate electrode in a bottom portion of the opening, the bottom portion including at least a corner, the gate potential of a minimum potential-holding member can be interrupted and the breakdown voltage characteristics can be stably achieved.

The invention claimed is:

1. A vertical semiconductor device including a GaN-based stacked layer having an opening,
the GaN-based stacked layer including n-type GaN-based drift layer/p-type GaN-based barrier layer/n-type GaN-based contact layer in that order, the opening extending from a top layer and reaching the n-type GaN-based drift layer, the semiconductor device comprising:
a regrown layer located so as to cover a wall surface and a bottom portion of the opening, the regrown layer including an electron drift layer and an electron supply layer;
a source electrode that is in contact with the n-type GaN-based contact layer and the regrown layer around the opening; and
a gate electrode located on the regrown layer and having a terminal portion in the opening,
wherein the gate electrode covers a portion of a wall surface of the regrown layer, the portion of the wall surface of the regrown layer being in contact with the p-type barrier layer in the opening, and the gate electrode is terminated at the terminal portion on the wall surface, the terminal portion of the gate electrode being away from a bottom portion of the regrown layer that covers the bottom portion of the opening.

2. The semiconductor device according to claim 1, further comprising a field plate electrode in the bottom portion of the regrown layer, the field plate electrode being located so as to cover at least a ridge at which the wall surface and bottom portion of the regrown layer intersect each other and so as to be away from the gate electrode.

3. The semiconductor device according to claim 2, further comprising an insulating film disposed between the bottom portion of the regrown layer and the field plate electrode.

4. The semiconductor device according to claim 3, further comprising an insulating layer disposed on the regrown layer and below the gate electrode.

5. The semiconductor device according to claim 1, further comprising an insulating layer disposed on the regrown layer and below the gate electrode.

6. The semiconductor device according to claim 1, wherein the opening has an outwardly slanted wall surface and, in a plan view, the terminal portion of the gate electrode lies outside a ridge at which the bottom portion and the wall surface of the opening intersect each other.

7. The semiconductor device according to claim 1, wherein the gate electrode does not cover the bottom portion of the regrown layer that covers the bottom portion of the opening.

* * * * *